United States Patent
Kikushima

(10) Patent No.: US 8,294,338 B2
(45) Date of Patent: Oct. 23, 2012

(54) PIEZOELECTRIC RESONATOR ELEMENT WITH A PLURALITY OF GROOVES, PIEZOELECTRIC RESONATOR, AND ACCELERATION SENSOR

(75) Inventor: Masayuki Kikushima, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/242,093

(22) Filed: Sep. 23, 2011

(65) Prior Publication Data

US 2012/0017680 A1  Jan. 26, 2012

Related U.S. Application Data

(63) Continuation of application No. 12/950,129, filed on Nov. 19, 2010, now Pat. No. 8,053,958, which is a continuation of application No. 12/256,162, filed on Oct. 22, 2008, now Pat. No. 7,936,115.

(30) Foreign Application Priority Data

Nov. 2, 2007 (JP) ................................ 2007-285890

(51) Int. Cl.
*H03H 9/19* (2006.01)
(52) U.S. Cl. ....................................... 310/370
(58) Field of Classification Search ............ 310/370
See application file for complete search history.

(56) References Cited

U.S. PATENT DOCUMENTS

| | | | |
|---|---|---|---|
| 6,897,737 B2 | 5/2005 | Sakata et al. | |
| 6,960,870 B2 | 11/2005 | Kikushima et al. | |
| 6,976,295 B2 | 12/2005 | Kikushima et al. | |
| 7,015,630 B2 | 3/2006 | Tanaya | |
| 7,122,945 B2 * | 10/2006 | Satoh et al. | 310/370 |
| 7,535,159 B2 | 5/2009 | Kizaki | |
| 7,851,980 B2 * | 12/2010 | Kizaki | 310/370 |
| 8,102,103 B2 * | 1/2012 | Furuhata et al. | 310/370 |
| 2006/0186768 A1 | 8/2006 | Kawanishi et al. | |
| 2007/0228897 A1 | 10/2007 | Umeki | |
| 2008/0238557 A1 | 10/2008 | Kizaki | |
| 2009/0077781 A1 * | 3/2009 | Amano | 29/25.35 |
| 2010/0156237 A1 * | 6/2010 | Ichikawa et al. | 310/370 |
| 2011/0241790 A1 * | 10/2011 | Amano | 331/156 |

FOREIGN PATENT DOCUMENTS

| | | |
|---|---|---|
| JP | A-11-312948 | 11/1999 |
| JP | A-2003-188678 | 7/2003 |
| JP | A-2004-200917 | 7/2004 |
| JP | A-2004-350015 | 12/2004 |
| JP | A-2005-151423 | 6/2005 |

(Continued)

OTHER PUBLICATIONS

Mar. 4, 2011 Office Action issued in U.S. Appl. No. 12/950,129.
Jun. 27, 2011 Notice of Allowance issued in U.S. Appl. No. 12/950,129.

*Primary Examiner* — J. San Martin
(74) *Attorney, Agent, or Firm* — Oliff & Berridge, PLC

(57) ABSTRACT

A piezoelectric resonator element includes: a resonating arm extending in a first direction and cantilever-supported; a base portion cantilever-supporting the resonating arm; and an excitation electrode allowing the resonating arm to perform flexural vibration in a second direction that is orthogonal to the first direction. In the piezoelectric resonator element, the resonating arm includes an adjusting part adjusting rigidity with respect to a bend in a third direction that is orthogonal to the first and second directions.

4 Claims, 10 Drawing Sheets

FOREIGN PATENT DOCUMENTS

| | | |
|---|---|---|
| JP | A-2006-086726 | 3/2006 |
| JP | A-2007-093485 | 4/2007 |
| JP | A-2007-158386 | 6/2007 |
| JP | B2-3941736 | 7/2007 |
| JP | A-2008-060952 | 3/2008 |
| JP | A-2008-252800 | 10/2008 |
| JP | A-2009-081520 | 4/2009 |
| JP | A-2010-119095 | 5/2010 |

* cited by examiner

FIG.10A

| | UNIT: μm |
|---|---|
| WIDTH OF RESONATING ARM | 104 |
| LENGTH OF RESONATING ARM | 1644 |
| WIDTH OF GROOVE | 70 |
| LENGTH OF GROOVE* | 820 |
| DEPTH OF GROOVE | 35 |
| THICKNESS OF TUNING FORK TYPE PIEZOELECTRIC RESONATOR ELEMENT | 100 |
| ENTIRE LENGTH OF TUNING FORK TYPE PIEZOELECTRIC RESONATOR ELEMENT | 2200 |

*LENGTH OF RESONATING ARM IS FINE ADJUSTED

FIG.10B

| SPECIFICATION OF TUNING FORK TYPE PIEZOELECTRIC RESONATOR ELEMENT | Fd (Hz) | FREQUENCY DEVIATION (ppm/1G) THICKNESS DIRECTION SENSITIVITY |
|---|---|---|
| (1) ISOTROPIC, NO GROOVE | 32700 | 0.0001 |
| (2) ANISOTROPIC, NO GROOVE | 32700 | 0.0200 |
| (3) ANISOTROPIC, WITH GROOVE AT +Z-AXIS PLANE SIDE | 32700 | 0.0100 |
| (4) ANISOTROPIC, WITH GROOVE AT -Z-AXIS PLANE SIDE | 32700 | 0.0250 |

PIEZOELECTRIC RESONATOR ELEMENT WITH A PLURALITY OF GROOVES, PIEZOELECTRIC RESONATOR, AND ACCELERATION SENSOR

This is a Continuation of application Ser. No. 12/950,129 filed Nov. 19, 2010, which in turn is a Continuation of application Ser. No. 12/256,162 filed Oct. 22, 2008. The disclosure of the prior applications is hereby incorporated by reference herein in its entirety.

BACKGROUND

1. Technical Field

The present invention relates to a piezoelectric resonator element, a piezoelectric resonator, and an acceleration sensor that reduce sensitivity in other axis.

2. Related Art

In tuning fork type quartz crystal resonators, shapes of front and back faces (XY plane) of a resonating arm are commonly symmetrical. JP-A 2004-200917, for example, discloses a tuning fork type quartz crystal resonator including a resonating arm that has a recessed groove on its front and back faces. Tuning fork type quartz crystal resonators can be used as an acceleration sensor for detecting acceleration in Y-axis direction when a longitudinal direction of a resonating arm thereof is defined as Y-axis. In a case where the tuning fork type quartz crystal resonators perform accelerated motion toward +Z-axis direction that is a thickness direction of the resonators, the resonating arm of the resonators is affected by inertia force so as to bend in −Z-axis direction. On the other hand, in a case where the tuning fork type quartz crystal resonators perform accelerated motion toward −Z-axis direction, the resonating arm thereof bends in +Z-axis direction.

The inventor surveyed distribution of stress in a state that a resonating arm of a tuning fork type piezoelectric resonator composed of a Z-cut quartz crystal plate is bent, and found that the stress concentrates on a plane at +Z plane side. That is, the inventor found that a neutral plane that receives no compression and no tension by flexure is disproportionately formed at the +Z plane side. Accordingly, the rigidity at the +Z plane side of the tuning fork type quartz crystal resonator is higher than that at −Z plane side.

The tuning fork type quartz crystal resonator is mainly composed of the Z-cut quartz crystal plate as described above. In this case, the bonding state of crystal in the thickness direction is asymmetric, whereby the resonator has anisotropy in the thickness direction. That is, in a case where the tuning fork type quartz crystal resonator is turned over, an alignment of crystal of the resonator is not same as that before the turning over of the resonator. It is considerable that an elastic constant, a piezoelectric constant, and the like that relate to bending stress on the +Z plane are not same as those on the −Z plane due to the anisotropy so as to generate difference of rigidity, whereby the rigidity at the +Z plane side is higher in a case of quartz crystal.

In a case where the tuning fork type quartz crystal resonator in which the rigidity at the +Z plane side is different from that at the −Z plane side is used as an acceleration sensor for detecting acceleration in Y-axis direction, the acceleration sensor responds to acceleration in Z-axis direction, that is, the sensitivity in other axis is generated. Therefore, an accurate detecting result of acceleration in Y-axis direction can not be obtained.

It is considerable that such problem of the sensitivity in other axis occurs as follows. In a case where the rigidity at the +Z plane side with respect to flexure in Z-axis direction and that at the −Z plane side are unbalanced, if the tuning fork type quartz crystal resonator is excited so as to be allowed to perform flexural vibration, the +Z plane side from the neutral plane described above has strong rigidity with respect to the flexural vibration and the −Z plane side has weak rigidity. As a result, amplitude of vibration at the −Z plane side becomes larger than that at the +Z plane side. Therefore, the resonating arm is drawn toward the +Z plane side due to tensile stress from the +Z plane that has large rigidity at a part where the amplitude of vibration is large. Accordingly, the resonating arm does not vibrate horizontally to a plane formed by the tuning fork type quartz crystal resonator having a plate shape as a whole. That is, the resonating arm of the tuning fork type quartz crystal resonator vibrates not only in X-axis direction but also in Z-axis direction. In a case where the tuning fork type quartz crystal resonator performs accelerated motion under such vibrating state, a vibrating component in Z-axis direction of the resonating arm receives inertia force due to the acceleration in Z-axis direction, whereby a vibrating frequency in Z-axis direction varies. In accordance with the variation of the vibrating frequency in Z-axis direction, the resonance frequency of the resonating arm vibrating in X-axis direction varies. Then, this effect appears as a noise together with a desired resonance frequency of the tuning fork type quartz crystal resonator.

SUMMARY

An advantage of the present invention is to provide a piezoelectric resonator element in which the rigidities of both faces thereof with respect to the flexural vibration described above are balanced and sensitivity in other axis is reduced; a piezoelectric resonator provided with the piezoelectric resonator element; and an acceleration sensor provided with the same.

The above advantage can be attained by the following aspects of the invention.

A piezoelectric resonator element according to a first aspect of the invention includes: a resonating arm extending in a first direction and cantilever-supported; a base portion cantilever-supporting the resonating arm; and an excitation electrode exciting the resonating arm to perform flexural vibration in a second direction that is orthogonal to the first direction. In the resonator element, the resonating arm includes an adjusting part for the rigidity with respect to a bend in a third direction that is orthogonal to the first direction and the second direction.

In the piezoelectric resonator element composed of a piezoelectric plate, rigidities with respect to a bending stress and the like on faces are sometimes different from each other due to the anisotropy of the plate. If such piezoelectric resonator element is excited to perform flexural vibration by the excitation electrode, the vibration includes not only a component in a predetermined vibrating direction but also a component of vibration in a direction that is orthogonal to the predetermined vibrating direction. Therefore, according to the first aspect, striking the balance between the rigidities with respect to the flexural vibration can reduce a component of vibration in a direction that is orthogonal to the direction of the flexural vibration of the resonating arm. Accordingly, the piezoelectric resonator element that reduces the occurrence of deviation, which is caused by the acceleration from the third direction, of the resonance frequency of the flexural vibration can be formed.

A piezoelectric resonator element according to a second aspect of the invention includes: a resonating arm composed of a Z-cut piezoelectric plate and cantilever-supported in a longitudinal direction; a base portion cantilever-supporting the resonating arm; and an excitation electrode exciting the resonating arm to perform flexural vibration in a direction orthogonal to a thickness direction. In the resonator element, the resonating arm includes an adjusting part adjusting rigidity with respect to a bend in the thickness direction.

The piezoelectric resonator element composed of the Z-cut piezoelectric plate has different rigidities with respect to the bending stress and the like on the +Z plane and on the −Z plane due to its anisotropy. If such piezoelectric resonator element is excited to perform a flexural vibration by the excitation electrode, the vibration includes not only a component of vibration horizontal to a plane formed by the piezoelectric resonator element having a plate shape but also a component of vibration in an orthogonal direction (thickness direction) to the plane. Therefore, according to the second aspect, striking the balance between the rigidities with respect to the flexural vibration can reduce the component of vibration in the thickness direction of the resonating arms. Accordingly, the piezoelectric resonator element that reduces occurrence of deviation, which is caused by the acceleration from the thickness direction, of the resonance frequency of the flexural vibration can be formed.

In the piezoelectric resonator element of the second aspect, the adjusting part may be a groove formed from a base portion side of a +Z plane of the resonating arm along a free end side direction of the resonating arm.

In the resonator element of the aspect, the groove is formed on the +Z plane of the resonating arm in a manner positioned at the base portion side, which is a portion receiving the strongest bending stress due to the flexural vibration of the piezoelectric resonator element, so that the rigidity with respect to the bending stress caused by the flexural vibration at the +Z plane side is effectively reduced, striking the balance between the rigidity at the +Z plane side and that at the −Z plane side of the resonating arm. Consequently, the component of the flexural vibration in the thickness direction of the resonating arm can be reduced. Accordingly, the piezoelectric resonator element in which the detecting sensitivity of the acceleration in the thickness direction, that is, the sensitivity in other axis is reduced can be formed.

In the piezoelectric resonator element of the second aspect, the adjusting part may be a recess formed at the base portion side of the +Z plane of the resonating arm.

In the resonator element of the aspect, the recess is formed on the +Z plane of the resonating arm in a manner positioned at the base portion side, which is a portion receiving the strongest bending stress due to the flexural vibration of the piezoelectric resonator element, so that the rigidity with respect to the bending stress caused by the flexural vibration at the +Z plane side can be effectively reduced only by etching a smaller region than the case of the groove described above. Further, a high-accurate patterning such that positioning of the groove is conducted by photolithography is not required, being able to increase a yield in manufacturing a piezoelectric resonator element.

In the piezoelectric resonator element of the second aspect, the adjusting part may include a first groove formed from the base portion side of the +Z plane of the resonating arm along the free end direction of the resonating arm and a second groove formed from the base portion side of a −Z plane of the resonating arm along the free end direction of the resonating arm, and the first groove may be formed deeper than the second groove.

In the resonator element of the aspect, the grooves are formed on both faces of the resonating arm in a manner positioned at the base portion side, which is a portion receiving the strongest bending stress due to the flexural vibration of the piezoelectric resonator element, being able to decrease a CI value of the piezoelectric resonator element. Further, forming the groove on the +Z plane side deeper than that on the −Z plane reduces a relative intensity difference between the rigidity with respect to the bending stress caused by the flexural vibration at the +Z plane side and the rigidity at the −Z plane side so as to strike the balance between the rigidities with respect to the flexural vibration of the resonating arm at the +Z plane side and at the −Z plane side, being able to reduce the component of the flexural vibration in the thickness direction of the resonating arm. Accordingly, the piezoelectric resonator element in which the detecting sensitivity of acceleration in the thickness direction, that is, the sensitivity in other axis is reduced and have a low CI value can be formed.

In the piezoelectric resonator element of the second aspect, the adjusting part may include a first groove formed from the base portion side of the +Z plane of the resonating arm along the free end direction of the resonating arm and a second groove formed from the base portion side of the −Z plane of the resonating arm along the free end direction of the resonating arm, and an end at the base portion side of the first groove may be positioned closer to the base portion than an end at the base portion side of the second groove.

In the resonator element of the aspect, the groove is formed on the +Z plane side of the resonating arm in a manner positioned at the base portion side, which is a portion receiving the strongest bending stress due to the flexural vibration of the piezoelectric resonator element, so that the rigidity with respect to the bending stress caused by the flexural vibration at the +Z plane side is effectively reduced, being able to strike the balance between the rigidity at the +Z plane side and that at the −Z plane side. Further, the groove at the +Z plane and the groove at the −Z plane do not interfere with each other in the depth direction. Therefore, the design versatility in the depth direction of the groove is further improved. At the same time, since the groove can be designed deeper, the piezoelectric resonator element that has a further reduced CI value can be formed. Further, since asymmetry property in the thickness direction is further improved, suppressing effect of an occurrence of unnecessary vibration caused by the thickness dimension can be improved.

The piezoelectric resonator element of the second aspect, an overlapping region in which the end at the base portion side of the second groove is positioned closer to the base portion than the end at a free end side of the first groove and the first groove and the second groove are overlapped with each other when they are viewed from the thickness direction may be formed at the end at the base portion side of the second groove.

In such structure, the groove at the +Z plane side and the groove at the −Z plane side do not interfere with each other in the depth direction, improving the design versatility of the grooves in the depth direction. Further, the resonating arm is thin in the thickness direction and the distance between the excitation electrodes formed in the grooves of the both faces is short in the overlapping region, being able to apply large electrical field to the overlapping region. Therefore, the piezoelectric resonator element having further reduced CI value can be formed. In addition, a groove region contacts with an etchant more sparsely than an outer shape region, so that the etching velocity in the groove region is slower than that in the outer shape region. Therefore, no particular process for digging the groove is required and the groove can be formed at the same time with the outer shape blanking of the piezoelectric resonator element, being able to form the piezoelectric resonator element having a higher yield.

In the piezoelectric resonator element of the second aspect, the adjusting part may include a first groove formed from the base portion side of the +Z plane of the resonating arm along the free end direction of the resonating arm, a second groove formed from the base portion side of the −Z plane of the resonating arm along the free end direction of the resonating arm, and a beam formed at the base portion side of the second groove.

In such structure, the groove can be formed short so as to make the base portion side, which is a portion receiving the strongest bending stress due to the flexural vibration of the piezoelectric resonator element, of the resonating arm thick. Therefore, even though the beam is formed short, the rigidity with respect to the bending stress caused by the flexural vibration at the −Z plane side is increased relatively to that at the +Z plane side so as to strike the balance between the rigidity at the +Z plane side and that at the −Z plane side. Further, since the length of the groove to which the excitation electrode film is formed can be sufficiently secured, an electrode of the piezoelectric resonator element can be widely formed in the groove. Since the grooves are formed on the both faces, the piezoelectric resonator element having an IC value that is not inferior to that of the above piezoelectric resonator element can be formed. Further, forming the beam improves the asymmetry property in the thickness direction, improving the suppressing effect of the occurrence of the unnecessary vibration depending on the thickness dimension.

In the piezoelectric resonator element of the second aspect, the beam may be formed apart from the base portion side to the free end side of the second groove.

In such structure, as the beam is moved to be farther from the base portion side and closer to the free end side in the groove on the −Z plane, the rigidity with respect to the bending stress caused by the flexural vibration on the −Z plane can be decreased. Therefore, proper determination of the position of the beam can fine adjust the rigidity at the −Z plane of the resonating arm. In addition, if the position of the beam is properly determined, the degree of the asymmetry in the thickness direction can be determined, being able to optimize for suppressing the unnecessary vibration.

In the piezoelectric resonator element of the first aspect, the adjusting part may include a first electrode film formed on the +Z plane of the resonating arm and a second electrode film formed on the −Z plane of the resonating arm and being thinner than the first electrode film.

In such structure, the electrode film on the −Z plane is formed thicker than that on the +Z plane without conducting a specific etching treatment for forming the groove and the like described above on the piezoelectric resonator element so as to relatively increase the rigidity with respect to the bending stress caused by the flexural vibration at the −Z plane side. Thus, the rigidities with respect to the flexural vibration of the both faces are balanced so as to be able to reduce a component of the flexural vibration in the thickness direction of the resonating arm. Accordingly, the piezoelectric resonator element in which the detecting sensitivity of the acceleration in the thickness direction, that is, the sensitivity in other axis is reduced can be formed. Further, since the piezoelectric resonator element requires no grooves, for example, formed thereon, a manufacturing process does not become complex, being able to increase a yield of manufacturing the piezoelectric resonator element. Further, if this structure is applied to the piezoelectric resonator element having any of the structures described above, the balance of the rigidities with respect to the flexural vibration is adjusted not only by the grooves and the like but also by the electrode films. Therefore, the adjusting range of the rigidities of the resonating arm is expanded, being able to more effectively reduce the sensitivity in other axis.

In the piezoelectric resonator element of the first aspect, the resonating arm may include two resonating arms, the excitation electrode may include a plurality of excitation electrodes, the two resonating arms may be cantilever-supported at the base portion in parallel, and an excitation electrode formed on one resonating arm and another excitation electrode formed on the other resonating arm may be coupled by cross wiring.

In such structure, the two resonating arms are formed in parallel from the base portion in a cantilever-supported state so as to be formed in a tuning fork type. Further, the excitation electrodes are cross-wired to the resonating arms. Accordingly, the tuning fork type piezoelectric resonator element that can perform an opposite phase vibration, that is, the flexural vibration in which the resonating arms move close to and apart from each other, as the fundamental wave mode, can be formed. Further, if any of the structures described above is applied to the piezoelectric resonator element, a piezoelectric resonator element in which the acceleration in the thickness direction, that is, the sensitivity in other axis is reduced can be formed.

A piezoelectric resonator and an acceleration sensor according to third and fourth aspects include the piezoelectric resonator element of any of the first and second aspects. The piezoelectric resonator element is mounted in a cantilever-supported state in which the base portion of the resonator element is used as a fixed end.

According to the third aspect, the piezoelectric resonator including the piezoelectric resonator element that uses the first direction or the longitudinal direction as a detecting axis and reduces the sensitivity in other axis by reducing a component of vibration in the Z-axis direction of the flexural vibration can be formed. According to the fourth aspect, the acceleration sensor including the piezoelectric resonator element that uses the first direction or the longitudinal direction as the acceleration detecting axis and reduces the sensitivity in other axis by reducing a component of vibration in the Z-axis direction of the flexural vibration can be formed. Further, the frequency adjustment after the mounting is conducted at the free end side of the resonating arm, while the rigidity adjustment is conducted at the base portion side of the resonating arm. Therefore, the frequency adjustment and the rigidity adjustment do not interfere to each other so as to be conducted independently.

BRIEF DESCRIPTION OF THE DRAWINGS

The invention will be described with reference to the accompanying drawings, wherein like numbers reference like elements.

FIGS. 10A and 10B are tables showing a result of a simulation of frequency variation of the tuning fork type piezoelectric resonator element.

DESCRIPTION OF EXEMPLARY EMBODIMENTS

Embodiments of a piezoelectric resonator element, a piezoelectric resonator, and an acceleration sensor according to the present invention will be described below based on a tuning fork type piezoelectric resonator element with reference to the accompanying drawings. It should be noted that the embodiments are applicable to a piezoelectric resonator element having one resonating arm or a piezoelectric resonator element having two or more of resonating arms.

First Embodiment

Figure 1A:
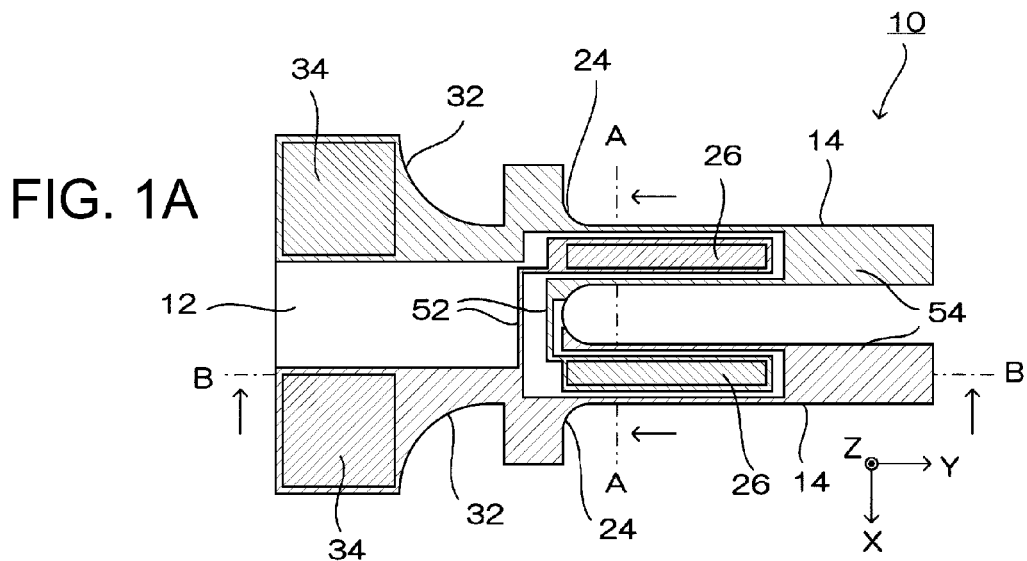
FIGS. 1A to 1C are schematic views showing a tuning fork type piezoelectric resonator element according to a first embodiment.
Figure 1B:
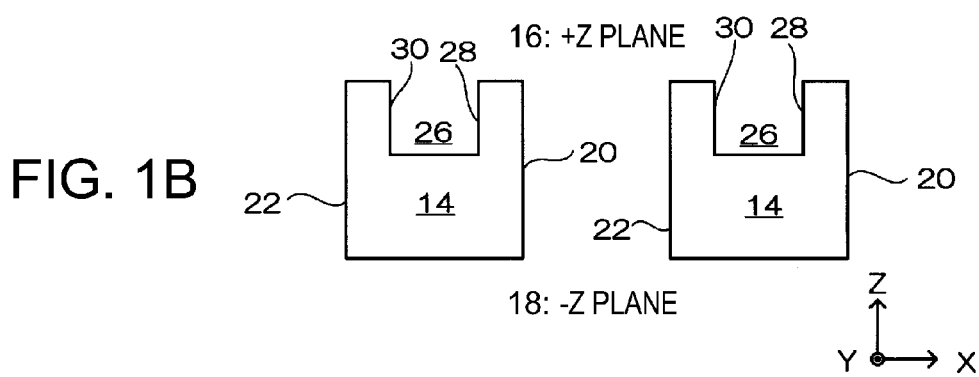
Figure 1C:
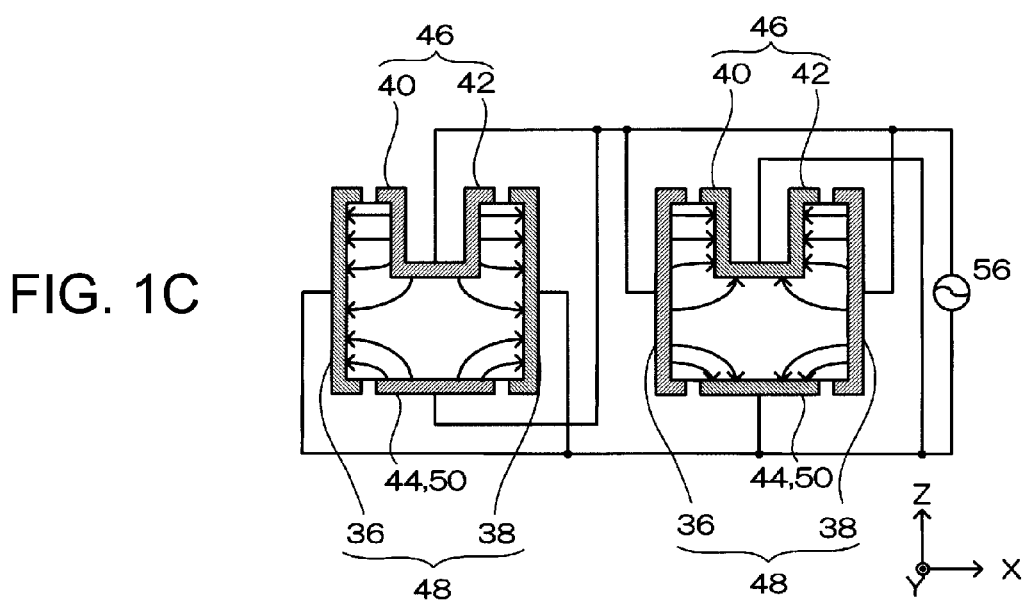

FIGS. 1A to 1C schematically show a tuning fork type piezoelectric resonator element according to a first embodiment of the invention. FIG. 1A is an overall view, and FIGS. 1B and 1C are sectional views taken along the A-A line of FIG. 1A. Note that later-described embodiments have a whole outer shape that is same as that of the first embodiment, so that the A-A line and the B-B line in FIG. 1A are applied to other embodiments. Further, note that directions of X axis, Y axis, and Z axis that are orthogonal to each other in FIGS. 1A to 1C and a relation between the axes and the tuning fork type piezoelectric resonator element are applied to other embodiments. Furthermore, note that flexural vibration of the tuning fork type piezoelectric resonator element is a fundamental wave mode in each of the embodiments.

The piezoelectric resonator element according to the first embodiment is composed of a Z-cut piezoelectric plate and includes two resonating arms cantilever-supported in a longitudinal direction; a base portion cantilever-supporting the resonating arms; and excitation electrodes allowing the resonating arms to perform flexural vibration in an orthogonal direction to the thickness direction. The two resonating arms are formed in parallel on the base portion to be cantilevered. The excitation electrode formed on one resonating arm is coupled with the excitation electrode formed on the other resonating arm by cross wiring. The resonating arms include an adjusting part for rigidity with respect to a bend in the thickness direction. The adjusting part is a groove formed on a +Z plane from a base portion side of the arms along a free end direction of the arms.

FIG. 1A is a plan view showing a tuning fork type piezoelectric resonator element 10 according to the first embodiment. The bottom view of the tuning fork type piezoelectric resonator element 10 is symmetric to the plan view of the same. The difference is that the bottom view does not have a groove 26. The tuning fork type piezoelectric resonator element 10 is made of a piezoelectric material such as quartz crystal, lithium tantalite, and lithium niobate. In a case of quartz crystal, a Z plane of which a normal line direction is Z axis that is one of quartz crystal axes is used. The crystal is practically cut such that the normal line of the Z plane forms a deflection angle of about 10 degrees at most with respect to the Z axis. The tuning fork type piezoelectric resonator element 10 includes a base portion 12 and a pair of resonating arms 14 extending from the base portion 12.

FIG. 1B is an enlarged sectional view showing the A-A line section of the tuning fork type piezoelectric resonator element 10 (the excitation electrodes are omitted for the description) shown in FIG. 1A. FIG. 1C is an enlarged sectional view showing the A-A line section of the tuning fork type piezoelectric resonator element 10 (with the excitation electrodes) shown in FIG. 1A. The resonating arms 14 have a +Z plane 16 (front face in a broad sense), and a −Z plane 18 (back face in a broad sense) that face opposite directions with each other, and a first lateral face 20 and a second lateral face 22 connecting the +Z plane 16 and the −Z plane 18 at the both sides.

On the other hand, the resonating arms 14 are cantilever-supported on the base portion 12 in such manner that the first lateral face 20 of one resonating arm 14 (left side in FIG. 1B) and the second lateral face 22 of the other resonating arm 14 (right side in FIG. 1B) are arranged in parallel to face each other. Therefore, an end, at the base portion 12 side, of the resonating arms 14 of the tuning fork type piezoelectric resonator element 10 is a fixed end, while the other end is a free end. In a case where the resonating arms 14 are allowed to perform the flexural vibration as the fundamental wave mode, the end at the base portion 12 side of the resonating arms 14 is a part that receives the strongest bending stress caused by the flexural vibration and the end at the free end side is a part that vibrates in the largest amplitude.

The resonating arm 14 has a root portion 24 (fixed end) connected to the base portion 12 and widened toward the base portion 12 side. Thus the resonating arm 14 is connected to the base portion 12 in its large-width portion, having high rigidity.

Each of the resonating arms 14 has the groove 26 formed on the +Z plane 16 and extending in the longitudinal direction. The groove 26 has a length equal to 50% to 70% of that of the resonating arms 14 in the longitudinal direction. The groove 26 has a width equal to 60% to 90% of that of the resonating arms 14. The groove 26 includes a first inner face 28 extending back on to the first lateral face 20, and a second inner face 30 extending back on to the second lateral face 22.

The groove 26 can decrease the rigidity with respect to the flexural vibration of the resonating arm 14 and at the same time, can form strong electrical fields between the first lateral face 20 and the first inner face 28 and between the second lateral face 22 and the second inner face 30, being able to obtain a high inverse piezoelectric effect. As a result, the resonating arms 14 can be effectively vibrated so as to be able to decrease a crystal impedance (CI) value. If the groove 26 is formed on the +Z plane 16 and on the other hand, no groove is formed on the −Z plane or a shallow or small groove is formed on the −Z plane, as described later, the difference between the rigidity with respect to the flexural vibration at the +Z plane 16 side and that at the −Z plane side can be cancelled.

The base portion 12 has a pair of constricted portions 32 opposed to each other so as to narrow the width thereof in the width direction (X-axis direction). The pair of constricted portions 32 is formed between mount parts 34 and the resonating arms 14 of the tuning fork type piezoelectric resonator element 10. Therefore, the constricted portions 32 block the transmission of vibration of the resonating arms 14 to suppress the transmission of the vibration (vibration leakage) through the base portion 12 and the resonating arms 14 to the outside, being able to prevent an increase of the CI value. As the length (depth) of the constricted portions 32 is made longer (deeper) to the extent that the strength of the base portion 12 can be secured, the suppressing effect of the vibration leakage is increased.

As shown in FIG. 1C, excitation electrode films are formed on the resonating arms 14. The excitation electrode films may have a multilayer structure including a Cr film serving as an underlying film having a thickness from 100 Å or more to 300 Å or less and an Au film having a thickness from 200 Å or more to 500 Å or less formed on the Cr film. The Cr film has high adhesion to quartz crystal and the Au film has low electric resistance and is resistant to oxidizing. The excitation electrode films include a first lateral face electrode 36 formed on the second lateral face 22; a second lateral face electrode film 38 formed on the first lateral face 20; a first inner face electrode film 40 formed on the second inner face 30; a second lateral face electrode film 42 formed on the first inner face 28; and a bottom face electrode film 44 formed on the –Z plane 18.

The first inner face electrode film 40 and the second inner face electrode film 42 are continuously formed in one groove 26 so as to be electrically connected with each other, forming a first excitation electrode film 46.

The first lateral face electrode film 36 and the second lateral face electrode film 38 formed on one resonating arm 14 so as to be electrically connected with each other, forming a second excitation electrode film 48.

The bottom face electrode film 44 forms a third excitation electrode film 50.

Here, the two resonating arms 14 are called a first resonating arm 14 and a second resonating arm 14. The first excitation electrode film 46 formed on the groove 26 of the first resonating arm 14 is coupled to an extraction electrode film 52 formed on the +Z plane 16 of the base portion 12 so as to be coupled to the second excitation electrode film 48 formed on the lateral face of the second resonating arm 14. The third excitation electrode film 50 formed on the –Z plane 18 of the first resonating arm 14 is coupled to an extraction electrode film (not shown) formed on the –Z plane 18 of the base portion 12 so as to be coupled to the second excitation electrode film 48 formed on the lateral face of the second resonating arm 14. The first lateral face electrode film 36 and the second lateral face electrode film 38 formed on the both lateral faces of the second resonating arm 14 are coupled to each other through a connecting electrode film 54 formed on at least one of the +Z plane 16 and the –Z plane 18 of the resonating arm 14 at the end side of the arm. The connecting electrode film 54 is allowed to serve as a weight for adjusting a frequency. For example, a resonating frequency can be increased by decreasing a mass of the connecting electrode film 54.

In the first embodiment, a voltage is applied between the first lateral face electrode film 36 and the first inner face electrode film 40, between the first lateral face electrode film 36 and the bottom face electrode film 44, between the second lateral face electrode film 38 and the second inner face electrode film 42, and between the second lateral face electrode film 38 and the bottom face electrode film 44. Thus one lateral end of the resonating arm 14 is extended and the other lateral end is contracted so as to bend and vibrate the resonating arm 14. In other words, a voltage is applied between the first excitation electrode film 46 and the second excitation electrode film 48 and between the third excitation electrode film 50 and the second excitation electrode film 48 in one resonating arm 14 so as to expand and contract the first lateral face 20 and the second lateral face 22 of the resonating arm 14, allowing the resonating arm 14 to perform the flexural vibration. It is found that as the length of the first and second excitation electrode films 46 and 48 in the longitudinal direction is increased, within an extent up to 70% of the length of the resonating arm 14, the CI value is decreased.

An operation of the tuning fork type piezoelectric resonator element 10 according to the first embodiment will be described with reference to FIG. 1C. Referring to FIG. 1C, a voltage is applied between the first excitation electrode film 46 and the second excitation electrode film 48 and between the third excitation electrode film 50 and the second excitation electrode film 48 in the first resonating arm 14, and a voltage is applied between the first excitation electrode film 46 and the second excitation electrode film 48 and between the third excitation electrode film 50 and the second excitation electrode film 48 in the second resonating arm 14.

Here, the first excitation electrode films 46, the second excitation electrode films 48, and the third excitation electrode films 50 are coupled to an alternating-current power supply by cross-wiring. The cross-wiring is such wiring that the first excitation electrode film 46 and the third excitation electrode film 50 of the first resonating arm 14 (positioned at the left side) have the same electric potential (+ potential in the example in FIG. 1C) as that of the second excitation electrode film 48 of the second resonating arm 14 (positioned at the right side), while the second excitation electrode film 48 of the first resonating arm 14 (positioned at the left side) has the same electrical potential (– potential in the example in FIG. 1C) as that of the first excitation electrode film 46 and the third excitation electrode film 50 of the second resonating arm 14 (positioned at the right side). Thus an alternating voltage serving as a driving voltage is applied to these electrode films 46, 48, and 50. Applying the voltage generates electric fields, as shown by arrows in FIG. 1C, so as to excite the resonating arms 14 such that they vibrate in opposite phases to each other (they vibrate such that the free ends of the resonating arms 14 move close to and apart from each other within a plane of which the normal line is the Z axis), thus performing flexural vibration. The alternating voltage is adjusted such that the resonating arms 14 vibrate in the fundamental mode.

Figure 2A:
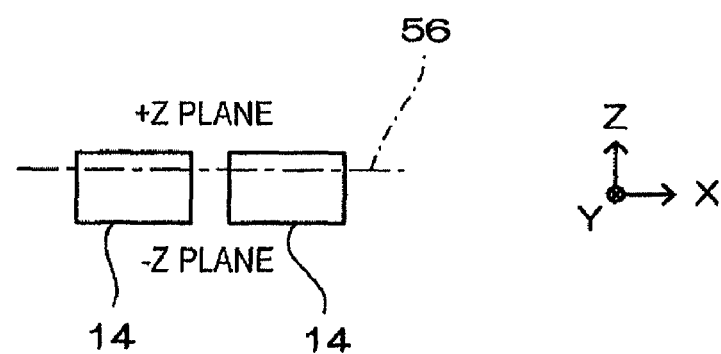
FIGS. 2A and 2B are A-A line sectional views showing a neutral face in a case where the tuning fork type piezoelectric resonator element bends in a thickness direction.
Figure 2B:
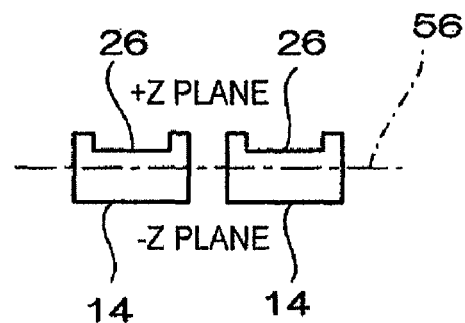

FIGS. 2A and 2B are sectional views taken along the A-A line of FIG. 1A. FIGS. 2A and 2B show a state, which is generated in a case where the tuning fork type piezoelectric resonator element 10 is bent in the Z-axis direction, of the neutral plane. FIG. 2A shows a case where the groove 26 is not formed, while FIG. 2B shows a case where the groove 26 is formed. As described above, in a case where an acceleration works in the Z-axis direction, the tuning fork type piezoelectric resonator element 10 bends, so that the tensile stress acts on the +Z plane 16 side and the compressive stress acts on the –Z plane 18 side. The neutral face 56 on which neither compression nor tension is generated is formed closer to the +Z plane 16 in the resonating arms 14, as shown in FIG. 2A. If such tuning fork type piezoelectric resonator element 10 is allowed to perform the flexural vibration, the vibration includes not only a vibrating component in the X-axis direction but also a vibrating component in the Z-axis direction. As a result, the vibrating component in the Z-axis direction in the flexural vibration receives inertia force due to the acceleration, fluctuating the vibrating frequency of the flexural vibration in the Z-axis direction. Accordingly, the resonance frequency of the flexural vibration in the X-axis direction of the resonating arms is fluctuated.

On the other hand, if the groove 26 is formed as shown in FIG. 2B, the resonating arms 14 having a one-face recessed section are formed. In the flexural vibration of the tuning fork type piezoelectric resonator element 10 in such state, the rigidity at the +Z plane 16 side with respect to the flexural vibration is effectively reduced because the groove 26 is formed from the root portion 24, which is a portion receiving the strongest bending stress due to the flexural vibration and positioned at the base portion 12 side, to the free end side, so as to remove the portion contributing to the rigidity with respect to the flexural vibration of the resonating arms 14. In this case, the neutral face 56 is shifted to an intermediate part in the thickness direction as shown in FIG. 2B, the difference between a bending moment of a component at the +Z plane 16 side from the neutral face 56 and a bending moment of a component at the −Z plane 18 side from the neutral face 56 is reduced, reducing the vibrating component in the Z-axis direction in the flexural vibration. Therefore, even if the tuning fork type piezoelectric resonator element 10 receives the acceleration from the Z-axis direction, the inertia force that the flexural vibration receives due to the acceleration from the Z-axis direction can be controlled to be small, being able to reduce the detecting sensitivity of the acceleration from the Z-axis direction.

As described above, the piezoelectric resonator element composed of the Z-cut piezoelectric plate has different rigidities with respect to the bending stress and the like on the +Z plane 16 and on the −Z plane 18 due to its anisotropy. Such piezoelectric resonator element is allowed to perform the flexural vibration by the excitation electrodes, the vibration includes not only a component of vibration horizontal to a plane formed by the piezoelectric resonator element having a plate shape but also a vibrating component in an orthogonal direction (thickness direction) to the plane. Therefore, according to the first embodiment, striking the balance between the rigidities with respect to the flexural vibration can reduce the vibrating component in the thickness direction of the resonating arms. Accordingly, the piezoelectric resonator element that reduces occurrence of deviation, which is caused by the acceleration from the thickness direction, of the resonance frequency of the flexural vibration can be formed. Further, according to the first embodiment, the groove 26 is formed on the +Z plane 16 of the resonating arms 14 in a manner positioned at the base portion 12, which is a part receiving the strongest bending stress due to the flexural vibration of the piezoelectric resonator element, so that the rigidity with respect to the bending stress caused by the flexural vibration at the +Z plane 16 side is effectively reduced, striking the balance between the rigidity at the +Z plane 16 side and that at the −Z plane 18 side of the resonating arms. Accordingly, the component of the flexural vibration in the thickness direction of the resonating arms 14 can be reduced. Therefore, the piezoelectric resonator element of which the detecting sensitivity of the acceleration in the thickness direction, that is, the sensitivity in other axis is reduced can be formed. The two resonating arms 14 are formed in parallel to each other from the base portion in a cantilever-supported state so as to be formed in a tuning fork type. Further, the excitation electrodes are cross-wired to the resonating arms 14. Accordingly, the tuning fork type piezoelectric resonator element that performs the flexural vibration, in which the resonating arms 14 move close to and apart from each other, as the fundamental wave mode, that is, a resonator element that can perform an opposite phase vibration can be formed. Further, if any of the following embodiments described later is applied to the piezoelectric resonator element described above, a piezoelectric resonator element in which the acceleration in the thickness direction, that is, the sensitivity in other axis is reduced can be formed.

Figure 9A:
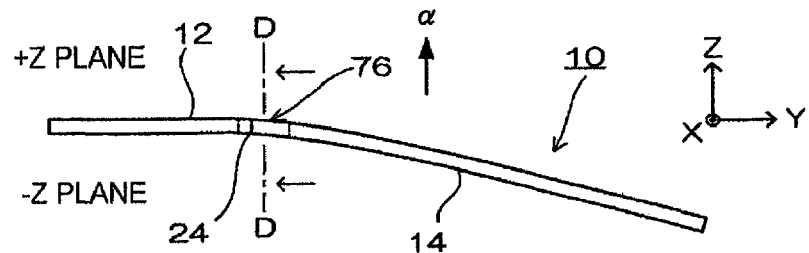
FIGS. 9A to 9D are schematic views showing stress distribution in a case where a tuning fork type piezoelectric resonator element bends in the thickness direction.
Figure 9B:
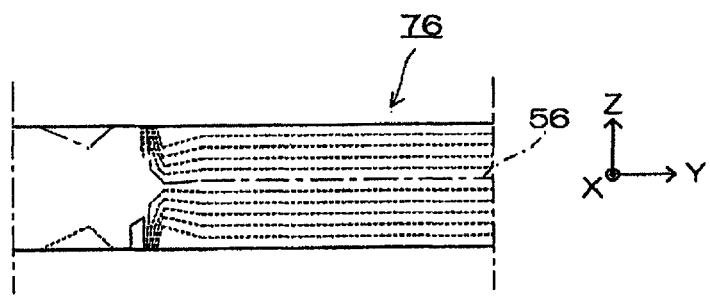
Figure 9C:
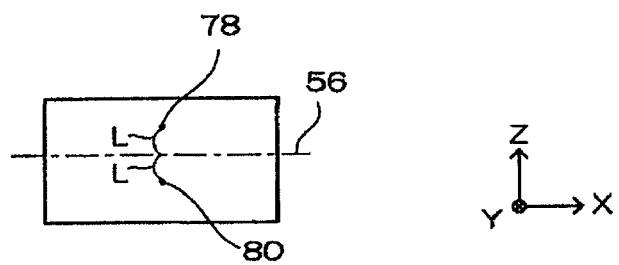
Figure 9D:
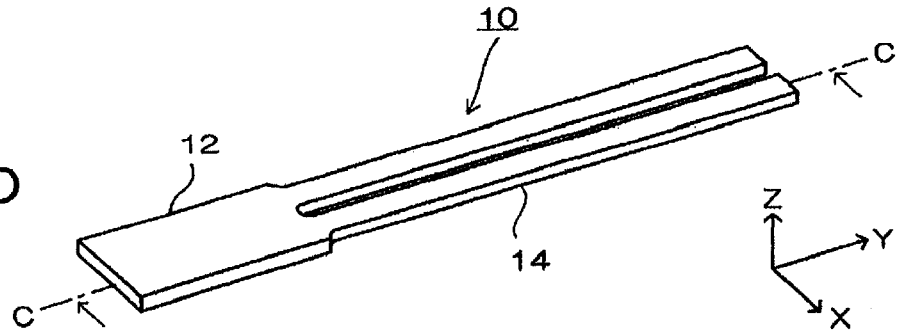

FIG. 9A is a sectional view taken along the C-C line of FIG. 9D that schematically shows the tuning fork type piezoelectric resonator element 10. FIG. 9A shows a state that the resonator element 10 is cantilever-supported on the base portion 12 and an acceleration a is applied in the Z-axis direction. Here, note that crystal axes of quartz crystal of the tuning fork type piezoelectric resonator element 10 are same as those in FIG. 1A, but the constricted portion, the groove, and the excitation electrodes are omitted so as to simplify the drawing. The resonating arms made of quartz crystal are set to have a length of 3200 μm and a width of 204 μm.

In a case where the acceleration a is applied in the Z-axis direction, that is, the normal line direction of the +Z plane 16, the inertia force works in the −Z plane 18 direction that is opposite to the direction in which the acceleration α is applied, in the resonating arms 14. As a result, the resonating arms 14 bend, so that the tensile stress is applied to the vicinity of the +Z plane 16 of the resonating arms 14 in the Y-axis direction (longitudinal direction), while the compressive stress is applied at the vicinity of the −Z plane 18 of the resonating arms 14 in the Y-axis direction.

The inventor simulated stress distribution in the Y-axis direction under the condition of the acceleration a of 500 G (G denotes an absolute figure of acceleration due to gravity) in FIG. 9A. FIG. 9B (Y-Z plane) shows a simulation result of the stress distribution in a region 76 that is at the vicinity of the root portion 24, while the FIG. 9C (X-Z plane) shows a simulation result of the stress distribution (neutral face) on the D-D line section.

As apparent from FIGS. 9A and 9B, the stress in the Y-axis direction continuously varies from a tensile stress to a compressive stress as a position is apart from the +Z plane 16 to be close to the −Z plane 18 so as to form a face on which the stress in the Y-axis direction becomes nil, that is, the neutral face 56. The inventor found that a distance between the neutral face 56 and the +Z plane 16 was shorter than the distance between the neutral face 56 and the −Z plane 18, that is, the neutral face 56 was shifted, from the simulation. The inventor considered that the shift of the neutral face 56 occurred because the rigidity with respect to the bending stress caused by the bend in the Z-axis direction at the +Z plane 16 side of the quartz crystal is higher than the rigidity at the −Z plane 18 side.

The inventor found that an absolute value of the tensile stress at a position 78 that is apart from the neutral face 56 toward the +Z plane 16 side at a distance L was higher than an absolute value of the compressive stress at a position 80 that is apart from the neutral face 56 toward the −Z plane 18 side at the distance L. That is, the inventor found the tendency that the stress concentrated on the +Z plane 16 side. From this, the inventor considered that the rigidity with respect to the bending stress caused by the flexural vibration as the fundamental mode of the tuning fork type piezoelectric resonator element 10 at the +Z plane 16 side from the neutral face 56 was different from the rigidity at the −Z plane 18 side from the neutral face 56.

A variation of a natural resonance frequency of the fundamental mode in a case where acceleration in the Z-axis direction, that is, in the normal line direction of the Z plane is applied to the tuning fork type piezoelectric resonator element 10 was evaluated by a simulation and the results are shown in FIG. 10B as frequency deviation. The frequency deviation is a frequency variation, per unit change quantity, of the acceleration in the normal line direction of the Z plane. The unit used in the embodiment is ppm/1 G. Here, the frequency variation per unit change quantity of the acceleration in the Z-axis direction is sometimes called thickness direction sensitivity.

Tuning fork type piezoelectric resonator elements used in the simulations were a resonator element (1) having a shape with no groove and made of an isotropic material; a resonator element (2) having a shape with no groove and made of an anisotropic material; a resonator element (3) having a groove formed at its +Z plane side and made of an anisotropic material; and a resonator element (4) having a groove formed at its −Z plane side and made of an anisotropic material.

The tuning fork type piezoelectric resonator elements (1) to (4) have the shape shown in FIGS. 1A to 1C except for presence of the groove, and each dimension thereof is defined as that shown in FIG. 10A. Here, the resonator element (3) having a groove formed at its +Z plane side and made of an anisotropic material has a resonating arm of 1644 μm, but other examples (1), (2), and (4) have resonating arms that are fine adjusted. If dimensions of other parts are not changed, natural resonance frequency Fd of the fundamental mode changes depending on the presence of a groove, the position of the groove, and the material. However, the length of the resonating arm is fine adjusted so as not to change dimensions of other parts and the natural resonance vibration frequency Fd. A natural resonance frequency of the fundamental wave mode of a cantilever is inversely proportional to the square of the length of the resonating arm in general.

As apparent from FIG. 10B, even in the examples having no groove, a frequency deviation of the example (2) made of the anisotropic material is larger in about two digits than the example (1) made of the isotropic material.

In a case of the examples made of the anisotropic material, a frequency deviation of the example (3) having a groove formed on the +Z plane side decreased to be about a half of that of the example (2) having no groove, while a frequency deviation of the example (4) having a groove on the −Z plane side increased over that of the example (2).

From these results, it is considerable that if a groove is formed on the +Z plane side of the resonating arm, the rigidity with respect to the bending stress caused by the flexural vibration at the +Z plane side is decreased so as to be balanced with the rigidity at the −Z plane side, accordingly decreasing the frequency deviation.

On the other hand, it is considerable that if a groove is formed on the −Z plane side of the resonating arm, the rigidity with respect to the bending stress caused by the flexural vibration at the −Z plane side is decreased so as to make the difference from the rigidity at the +Z plane side larger and disrupt the balance, accordingly increasing the frequency deviation.

Second Embodiment

Figure 3A:
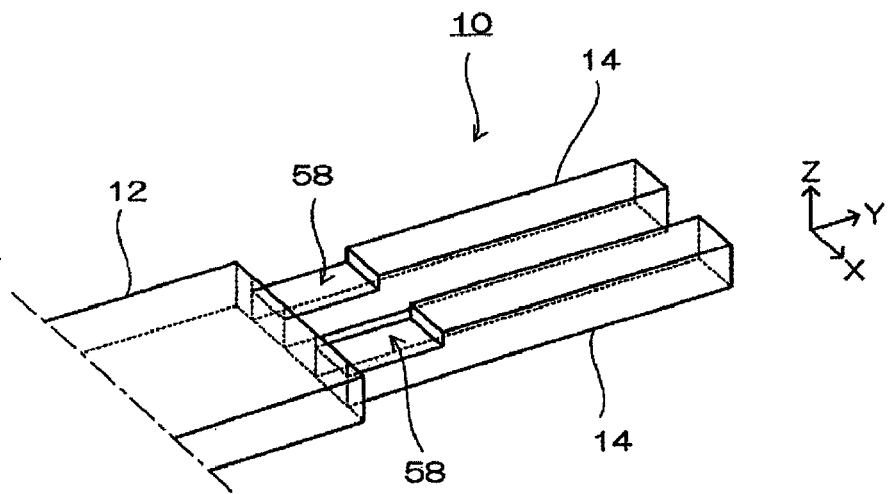
FIGS. 3A and 3B are schematic views showing a tuning fork type piezoelectric resonator element according to a second embodiment.
Figure 3B:
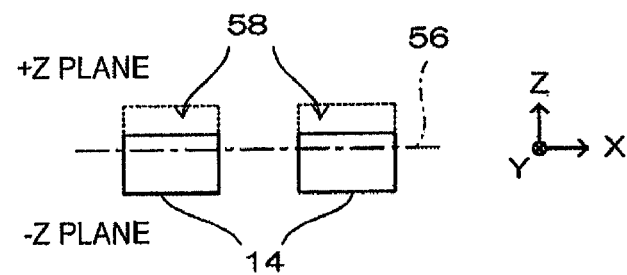

FIG. 3A is a schematic view showing a tuning fork type piezoelectric resonator element 10 according to a second embodiment and FIG. 3B is a sectional view showing an A-A line section of the resonator element 10. The tuning fork type piezoelectric resonator element 10 according to the second embodiment basically has the same configuration as that of the first embodiment. However, an adjusting part for adjusting the rigidity with respect to flexural vibration of the resonating arm in the resonator element 10 in the second embodiment is a recess formed on the +Z plane from the base portion side along the free end direction of the resonating arm. Here, the tuning fork type piezoelectric resonator element in the second embodiment and that in embodiments described later have an excitation electrode film, but the structure of the excitation electrode film is same as that in the first embodiment, so that the description thereof will be omitted.

In the second embodiment, a recess 58 can be formed by covering a tuning fork type piezoelectric resonator element plate (not shown) by a metal film in a manner leaving a portion on which a recess is to be formed and conducting an etching treatment. It is thinkable that the recess 58 is formed by widening the groove 26 of the first embodiment up to the same width as the width of the resonating arm 14 in the X-axis direction. The base portion 12 side of the resonating arm 14 is the portion that receives the strongest bending stress due to the flexural vibration, as described above. If the recess 58 is formed on the portion, a portion contributing most to the rigidity with respect to the flexural vibration is cut out more than a case forming the groove 26. Accordingly, in a case where a recess and a groove formed from the base portion 12 side along the free end direction of the resonating arm 14 to have the same lengths are compared to each other, it is clear that the adjusting effect of the recess with respect to the rigidity is larger than that of the groove. Conversely, the recess does not need to be formed to be long in the free end direction, and it is enough that the recess is formed in a small region including the base portion 12 side of the resonating arm 14.

According to the second embodiment, if the recess 58 is formed on the +Z plane 16 of the resonating arm 14 in a manner positioned at the base portion side, which is a portion receiving the strongest bending stress due to the flexural vibration of the piezoelectric resonator element, the rigidity with respect to the bending stress caused by the flexural vibration at the +Z plane 16 side can be effectively reduced only by etching a smaller region than the case of the first embodiment. Further, a high-accurate patterning in which positioning of the groove is conducted by photolithography is not required as a case described later, being able to increase a yield in manufacturing a piezoelectric resonator element.

Third Embodiment

Figure 4:
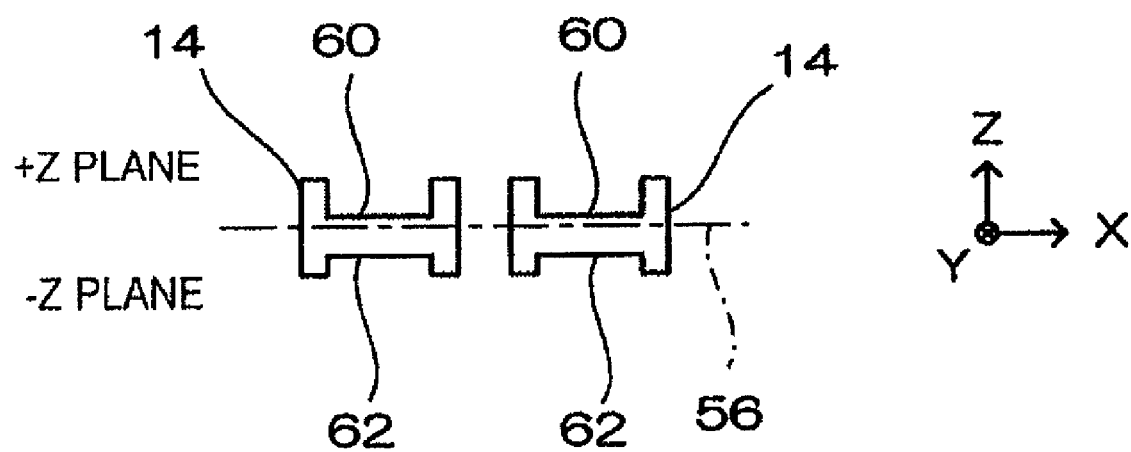
FIG. 4 is an A-A line sectional view showing a tuning fork type piezoelectric resonator element according to a third embodiment.

FIG. 4 is a sectional view showing an A-A line section of a tuning fork type piezoelectric resonator element 10 according to a third embodiment. The tuning fork type piezoelectric resonator element 10 according to the third embodiment has the same basic configuration as the first embodiment. However, an adjusting part for adjusting the rigidity of the resonating arm of the resonator element 10 in the third embodiment includes a first groove and a second groove. The first groove is formed on the +Z plane of the resonating arm from the base portion side along the free end direction, while the second groove is formed on the −Z plane of the resonating arm from the base portion side along the free end direction of the arm. The first groove is formed to be deeper than the second groove. Forming the grooves on the both faces further decreases the CI value of the tuning fork type piezoelectric resonator element 10 compared to the first embodiment. Here, the first groove and the second groove have different depths. Therefore, a +Z plane groove 60 that is the first groove and a −Z plane groove that is the second groove can not be patterned and etched together, so that they need to be formed by separate processes. Further, the position of the +Z plane groove 60 is same as that of the −Z plane groove 62 in the longitudinal direction of the resonating arm 14 when viewed from above, so that the sum of the depths of the grooves can not be larger than the thickness of the resonating arm 14.

If the +Z plane groove 60 and the −Z plane groove 62 are formed on the resonating arm 14 as this, a portion contributing to the rigidity with respect to the bending stress caused by the flexural vibration of the resonating arm 14 is removed, reducing the rigidity at the +Z plane 16 side and that at the −Z plane 18 side. However, the +Z plane groove 60 is formed deeper than the −Z plane groove 62, so that the rigidity at the +Z plane 16 side is smaller by ratio so as to be a relatively close value to the rigidity at the −Z plane 18 side. Consequently, the rigidity with respect to the bending stress caused by the flexural vibration at the +Z plane 16 side is balanced with that at the −Z plane 18 side.

According to the third embodiment, the grooves are formed on the root portion 24, which receives the strongest bending stress due to the flexural vibration of the piezoelectric resonator element, of the resonating arm 14, that is, on the both faces at the base portion 12 side so as to decrease the CI value of the tuning fork type piezoelectric resonator element. Further, the +Z plane groove 60 is formed deeper than the −Z plane groove 62 so as to reduce a relative intensity difference between the rigidity with respect to the bending stress caused by the flexural vibration at the +Z plane 16 side and the rigidity at the −Z plane 18 side. Thus the rigidity with respect to the flexural vibration at the +Z plane 16 side is balanced with the rigidity at the −Z plane 18 side so as to be able to reduce a component in the Z-axis direction of the flexural vibration of the resonating arm 14, that is, a component in the thickness direction. Accordingly, the piezoelectric resonator element in which the detecting sensitivity of the acceleration in the thickness direction, that is, the sensitivity in other axis is reduced and have a low CI value can be formed.

Fourth Embodiment

Figure 5A:
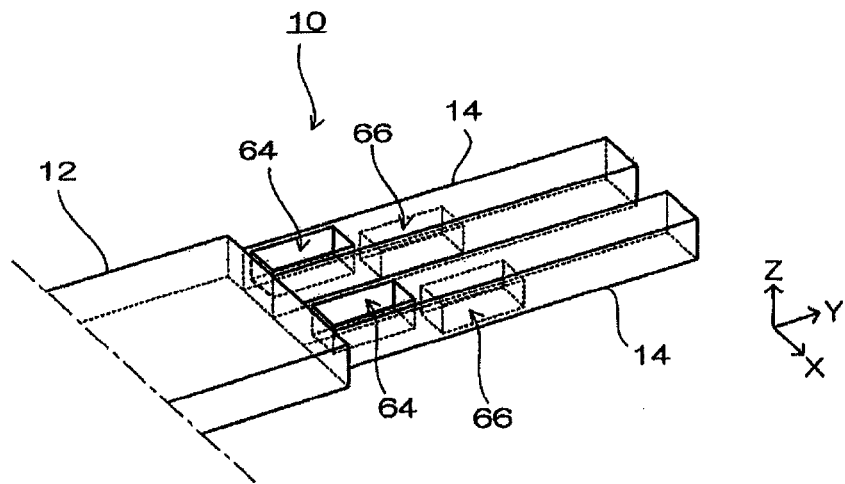
FIGS. 5A to 5C are schematic views showing a tuning fork type piezoelectric resonator element according to a fourth embodiment.
Figure 5B:
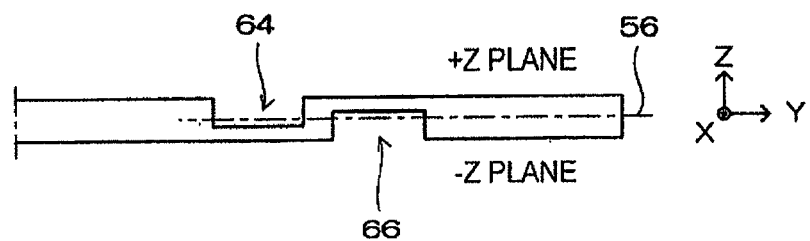

FIG. 5A is a schematic view showing a tuning fork type piezoelectric resonator element according to a fourth embodiment and FIG. 5B is a sectional view showing a B-B line section. The tuning fork type piezoelectric resonator element according to the fourth embodiment has the same basic configuration as that of the first embodiment. However, an adjusting part of the resonating arm in the resonator element of the fourth embodiment includes a first groove and a second groove. The first groove is formed on the +Z plane of the resonating arm from the base portion side along the free end direction and the second groove is formed on the −Z plane of the resonating arm from the base portion side along the free end direction of the arm. An end at the base portion side of the first groove is positioned closer to the base portion than an end at the base portion side of the second groove.

If a +Z plane groove 64 that is the first groove has a depth different from that of a −Z plane groove 66 that is the second groove, the grooves can not be formed together by patterning in a photolithography process and etching. However, if they have the same depths, they can be formed at a time. Since the −Z plane groove 66 is formed from a basing point that is positioned more free end side than a terminating end of the +Z plane groove 64 along the free end side, so that the +Z plane groove 64 and the −Z plane groove 66 do not interfere with each other, forming no penetrating hole in the thickness direction of the resonating arm 14. Therefore, the grooves can be formed to have a depth that is close to the thickness of the resonating arm 14. Accordingly, the CI value can be decreased more than the case in the third embodiment.

The +Z plane groove 64 is formed at the base portion 12 side, which is a portion receiving the strongest bending stress due to the flexural vibration, of the resonating arm 14, while the −Z plane groove 66 is formed on a position which receives small bending stress due to the flexural vibration and is quite apart from the base portion 12 of the resonating arm 14. Therefore, the +Z plane groove 64 have a larger reducing effect for the rigidity with respect to the bending stress caused by the flexural vibration.

According to the fourth embodiment, the groove is formed on the +Z plane 16 side of the resonating arm 14 in a manner positioned at the root portion 24, that is, at the base portion 12 side, which is a portion receiving the strongest bending stress due to the flexural vibration of the tuning fork type piezoelectric resonator element, so as to effectively reduce the rigidity with respect to the bending stress caused by the flexural vibration. Thus the rigidity with respect to the bending stress caused by the flexural vibration at the +Z plane 16 side can be balanced with that at the −Z plane 18 side. Further, the +Z plane groove 64 and the −Z plane groove 66 do not interfere with each other in the thickness direction. Therefore, the design versatility in the depth direction of the groove is improved more than that of the third embodiment. At the same time, since the groove can be designed deeper than that in the third embodiment, the piezoelectric resonator element that has a smaller CI value than that in the third embodiment can be formed. Further, asymmetry property in the thickness direction is improved compared to the third embodiment, being able to improve suppressing effect of an occurrence of unnecessary vibration caused by the thickness dimension.

Figure 5C:
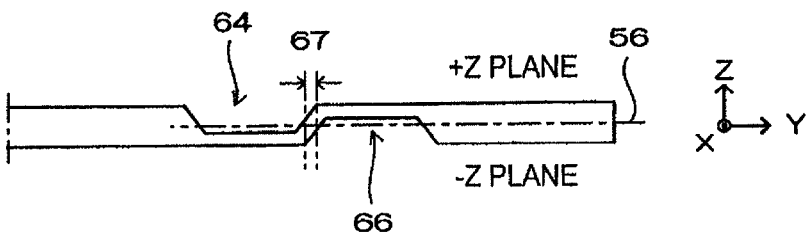

Furthermore, as shown in FIG. 5C, an overlapping region 67 on which the first groove and the second groove are overlapped when they are viewed from the thickness direction may be formed at the end at the base portion 12 side of the −Z plane groove 66. On the overlapping region 67, the end at the base portion 12 side of the −Z plane groove 66 that is the second groove is positioned closer to the base portion 12 than the end at the free end side of the +Z plane groove 64 that is the first groove. The overlapping region 67 can be formed depending on the difference between etching velocities of crystal faces. The difference is caused by anisotropy of crystal. Therefore, if the anisotropy etching is used, the +Z plane groove 64 and the −Z plane groove 66 can be formed while forming the overlapping region 67 without penetration.

In the structure shown in FIG. 5C, the +Z plane groove 64 that is formed at the +Z plane 16 side and the −Z plane groove 66 that is formed at the −Z plane 18 side do not interfere with each other in the depth direction, improving the design versatility of the grooves in the depth direction. Further, the resonating arm 14 becomes thin in the thickness direction and the distance between the excitation electrodes formed in the grooves of the both faces becomes short in the overlapping region 67, being able to apply large electrical field to the overlapping region 67. Therefore, the piezoelectric resonator element having further reduced CI value can be formed. Further, a groove region contacts with an etchant more sparsely than an outer shape region, so that the etching velocity in the groove region is slower than that in the outer shape region. Therefore, no particular process for digging the groove is required and the groove can be formed at the same time with the outer shape blanking of the piezoelectric resonator element, being able to form the piezoelectric resonator element having a higher yield than the cases described above.

Fifth Embodiment

Figure 6A:
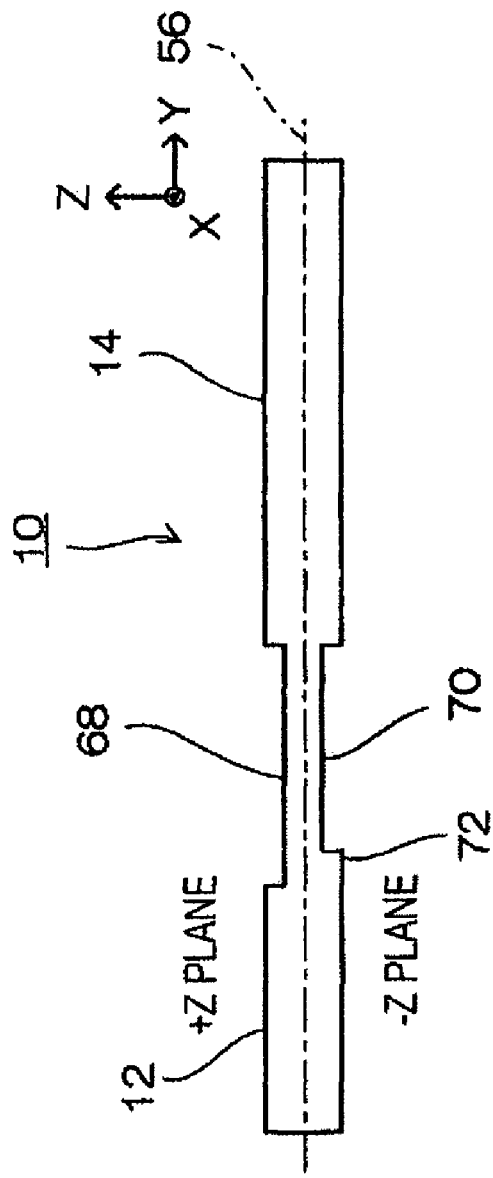
FIGS. 6A and 6B are B-B line sectional views showing a tuning fork type piezoelectric resonator element according to a fifth embodiment.

FIG. 6A is a sectional view showing a B-B line section of a tuning fork type piezoelectric resonator element according to a fifth embodiment. The tuning fork type piezoelectric resonator element 10 according to the fifth embodiment basically has the same configuration as that of the first embodiment as shown in FIG. 6A. However, an adjusting part of the resonating arm in the resonator element of the fifth embodiment includes a first groove, a second groove, and a beam. The first groove is formed on the +Z plane from the base portion side of the resonating arm along the free end direction. The second groove is formed on the −Z plane from the base portion side of the resonating arm along the free end direction. The beam is formed at the base portion side of the second groove and is positioned apart from the base portion side of the second groove to the free end side.

Since a +Z plane groove 68 that is the first groove and a −Z plane groove 70 that is the second groove have the same depths, they can be formed together by patterning and etching together with a beam 72. Since the depths and positions in the longitudinal direction of the grooves at the +Z plane 16 side and at the −Z plane 18 side are same, the rigidities with respect to the flexural vibration are decreased in the same proportion when only the grooves are considered. However, the beam 72 is formed in the −Z plane groove 70 on the root portion 24, that is, at the base portion 12 side so as to contribute to the increase of the rigidity with respect to the bending stress caused by the flexural vibration. Consequently, the rigidity at the −Z plane 18 side is increased relatively to that at the +Z plane 16 side, being able to strike the balance between the rigidity at the +Z plane 16 side and that at the −Z plane 18 side.

Figure 6B:
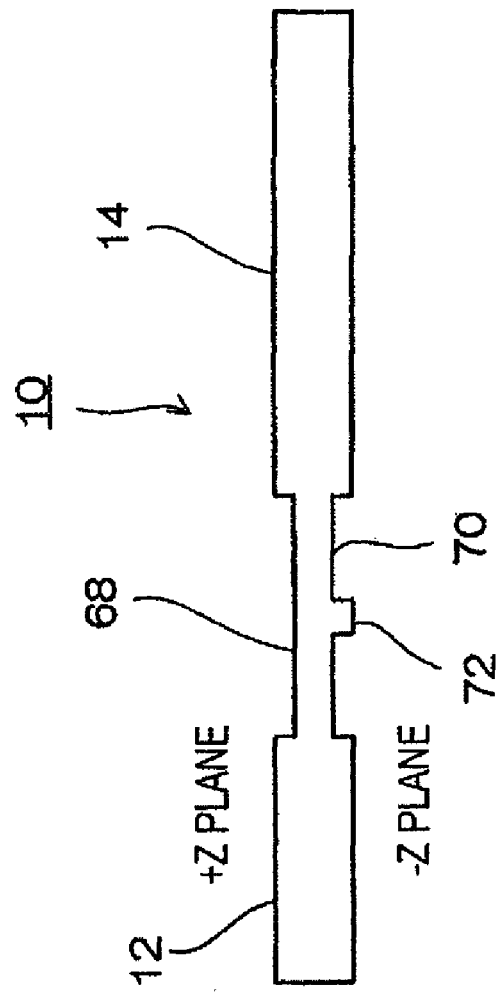

In addition, the position of the beam 72 can be arbitrarily determined in the −Z plane groove 70 in patterning, as shown in FIG. 6B. Since the root portion 24 of the resonating arm 14, that is, at the base portion 12 side of the arm 14 is a portion that receives the strongest bending stress due to the flexural vibration as described above, the rigidity with respect to the bending stress caused by the flexural vibration is increased most in a case where the beam 72 is formed on the base portion 12 side. If the beam 72 is formed on the free end side of the arm, the rigidity at the −Z plane 18 side is most decreased, but the rigidity at the −Z plane 18 side is adjusted to be larger than a case where the beam 72 is not formed in the −Z plane groove 70. Namely, changing the position of the beam 72 can control the rigidity at the −Z plane 18 side so as to strike the balance between the rigidity with respect to the bending stress caused by the flexural vibration at the +Z plane 16 side and that at the −Z plane 18 side.

According to the fifth embodiment, the −Z plane groove 70 can be formed to be shorter than the +Z plane groove 68 in order to make the base portion 12 side, which is a portion receiving the strongest bending stress due to the flexural vibration of the piezoelectric resonator element, of the resonating arm 14 thick. Therefore, even if the beam 72 is formed to be short, the rigidity with respect to the bending stress caused by the flexural vibration at the −Z plane 18 side is relatively increased so as to strike the balance between the rigidity of the resonating arm 14 at the +Z plane 16 side and that at the −Z plane 18 side. Further, since the length of the groove to which the excitation electrode film is formed can be sufficiently secured, electrodes of the piezoelectric resonator can be widely formed in the groove. Since the grooves are formed on the both faces, the piezoelectric resonator element having an IC value that is not inferior to that in the third embodiment can be formed. Further, forming the beam 72 improves the asymmetry property in the thickness direction compared to the third embodiment, improving the suppressing effect of the occurrence of the unnecessary vibration depending on the thickness dimension. Furthermore, the more the beam 72 is apart from the base portion 12 side to the free end side in the −Z plane groove 70, the more the rigidity with respect to the bending stress caused by the flexural vibration of the −Z plane 18 can be decreased. Therefore, proper determination of the position of the beam 72 can fine-adjust the rigidity with respect to the bending stress caused by the flexural vibration at the −Z plane 18 of the resonating arm 14. In addition, if the position of the beam 72 is properly determined, the degree of the asymmetry in the thickness direction can be determined, being able to optimize for controlling the unnecessary vibration.

Sixth Embodiment

Figure 7A:
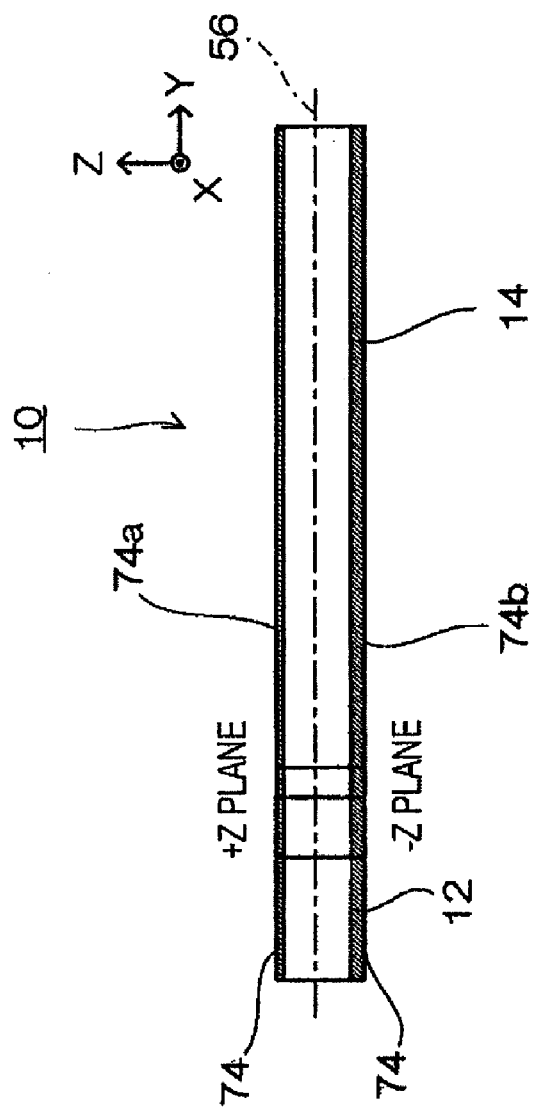
FIGS. 7A and 7B are B-B line sectional views showing a tuning fork type piezoelectric resonator element according to a sixth embodiment.

FIG. 7A is a sectional view showing a B-B line section of a tuning fork type piezoelectric resonator element 10 according to a sixth embodiment. The tuning fork type piezoelectric resonator element according to the sixth embodiment basically has the same configuration as that of the first embodiment. However, the adjusting part for adjusting the rigidity includes a first electrode film that is formed on the +Z plane of the resonating arm, and a second electrode film that is formed on the −Z plane of the resonating arm and is thicker than the first electrode film.

In the sixth embodiment, the balance between the rigidity with respect to the bending stress caused by the flexural vibration at the +Z plane 16 side and that at the −Z plane 18 side is adjusted by electrode films 74. The electrode film 74 is composed of a first excitation electrode film 46, a second excitation electrode film 48, and a third excitation electrode film 50 that vibrate the resonating arm 14 of the tuning fork type piezoelectric resonator element 10, an extraction electrode film 52, and a connecting electrode film 54. The electrode film 74 formed on the +Z plane 16 side of the resonating arm 14 is thinner than the electrode film 74 formed on the −Z plane 18 side so as to relatively increase the rigidity with respect to the bending stress caused by the flexural vibration at the −Z plane 18 side. Therefore, the neutral face 56 is shifted to the central region in the thickness direction so as to strike the balance between the rigidities with respect to the flexural vibration of the resonating arm 14. The electrode film 74 is made of Cr, Au, Al, and the like as described above. An electrode pattern of the electrode film 74 composed of the first excitation electrode film 46, the second excitation electrode film 48, the third excitation electrode film 50, the extraction electrode film 52, and the connecting electrode film 54 is same as that in the first embodiment.

In a case where the rigidity with respect to the bending stress caused by the flexural vibration of the resonating arm 14 is adjusted by using the electrode film 74, Young's moduli of quarts crystal and these metals are important. As Young's modulus increases, deformation with respect to tension and compression decreases, increasing the rigidity.

In this embodiment, Young's modulus (285 GPa) of Cr is higher than Young's modulus (82 GPa) of Au and that (69 GPa) of Al. On the other hand, Young's modulus of quartz crystal is about 100 GPa on the Z plane. Thus Young's modulus of Cr is higher than that of quartz crystal, so that an adjusting effect obtained by forming the electrode film 74b on the −Z plane 18 relatively thicker than the electrode film 74a on the +Z plane 16 is large in a case where the electrode films 74 are made of Cr.

Figure 7B:
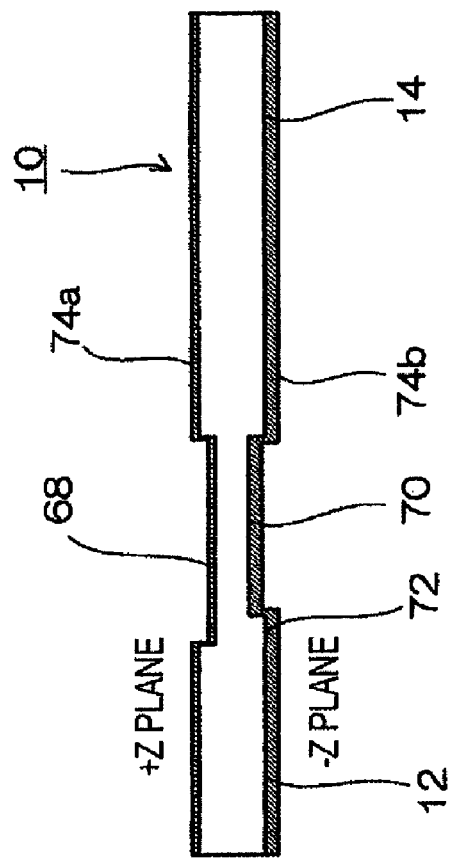

The electrode films 74 are formed by spattering and the like. If the time for spattering the −Z plane 18 side is made longer than that for spattering the +Z plane 16 side, for example, the electrode film 74 on the −Z plane 18 can be formed thicker than that on the +Z plane 16. Thus, adjusting the material and the thickness of the electrode film 74 can adjust the balance between the rigidity with respect to the bending stress caused by the flexural vibration on the +Z plane 16 and that on the −Z plane 18. Further, as shown in the B-B line sectional view of FIG. 7B, even after grooves and the like are formed on the tuning fork type piezoelectric resonator element 10 like the first to fifth embodiments (FIG. 7B shows a case using the fifth embodiment), the electrode films 74 can be formed with no limitation.

According to the sixth embodiment, the electrode film on the −Z plane 18 is formed thicker than that on the +Z plane 16 without conducting a specific etching treatment for forming the grooves and the like described above on the piezoelectric resonator element. This relatively increases the rigidity with respect to the bending stress caused by the flexural vibration at the −Z plane 18 side. Accordingly, the rigidities of the both faces with respect to the bending stress caused by the flexural vibration are balanced, being able to decrease a component of the flexural vibration in the Z-axis direction of the resonating arm 14. Therefore, the piezoelectric resonator element in which the detecting sensitivity of the acceleration in the Z-axis direction, that is, the thickness direction, that is, the sensitivity in other axis is reduced can be formed. Further, since the piezoelectric resonator element requires no grooves, for example, formed thereon, a manufacturing process does not become complex, being able to increase a yield of manufacturing the piezoelectric resonator element. In addition, if the present embodiment is applied to the piezoelectric resonator element of the first to fifth embodiments, not only the grooves and the like formed by etching but also the electrode films 74 adjust the balance between the rigidity with respect to the bending stress caused by the flexural vibration on the +Z plane 16 and that on the −Z plane 18. Therefore, the adjusting range of the rigidities on the +Z plane 16 and the −Z plane 18 is increased, being able to more effectively decrease the sensitivity in other axis.

Seventh Embodiment

Figure 8:
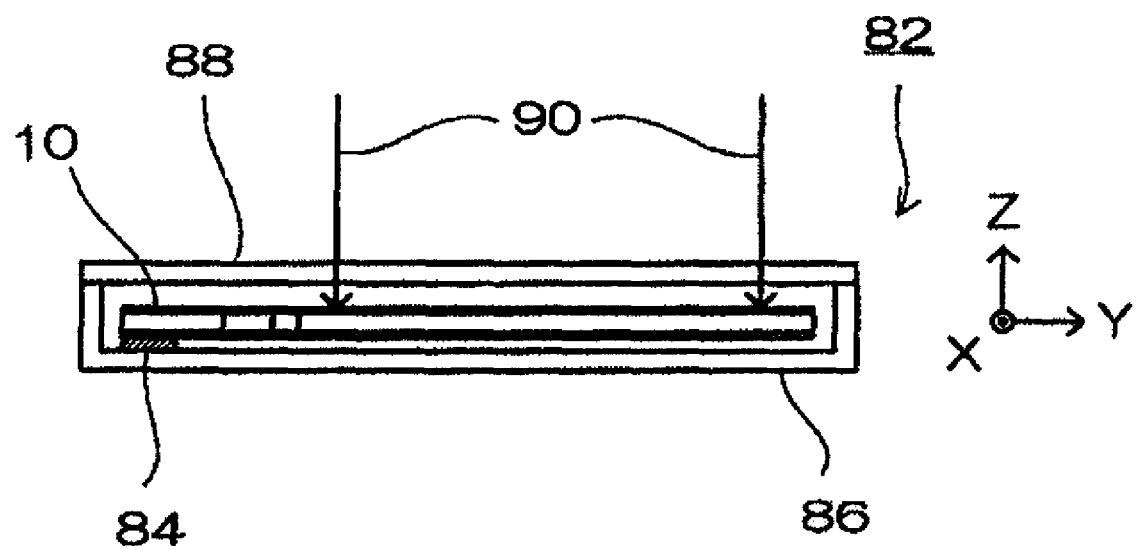
FIG. 8 is a schematic view showing an acceleration sensor according to a seventh embodiment.

FIG. 8 is a schematic view showing a piezoelectric resonator and an acceleration sensor according to a seventh embodiment. The piezoelectric resonator and the acceleration sensor according to the seventh embodiment are provided with the tuning fork type piezoelectric resonator element 10 of any of the first to sixth embodiments. The resonator element 10 is mounted such that the base portion 12 thereof is supported in a cantilever state. An acceleration sensor 82 of the seventh embodiment is formed such that an external circuit which is not shown is wired to a piezoelectric resonator composed of the piezoelectric resonator element 10, a mount electrode 84, a package 86, and a lid 88 made of thin plate glass and the like. The tuning fork type piezoelectric resonator element 10 is fixed in a cantilever-supported state that the base portion 12 as a fixing end is bonded through the mounting electrode 84 to a bottom face of the package 86. The lid 88 is bonded to the upper surface of the package 86 by seam welding, after the tuning fork type piezoelectric resonator element 10 is mounted on the package 86. With such structure, the acceleration sensor 82 that reduces the sensitivity in other axis such as the Z-axis direction, that is, the thickness direction and uses the Y-axis direction as the acceleration detecting axis can be formed.

The acceleration sensor 82 requires fine adjustment of a vibrating frequency after mounting. The fine adjustment of the vibrating frequency can be conducted such that a portion, which is positioned on the connecting electrode film 54 formed at the free end side of the resonating arm, of the electrode film 74 is removed by laser 90 so as to change a mass of the arm. However, even though a mass at the base portion 12 side is changed, the vibrating frequency hardly changes. On the other hand, the rigidities on the +Z plane 16 and on the −Z plane 18 can be adjusted by removing a portion, which covers the base portion 12 side of the resonating arm 14, of the electrode films 74 by the laser 90. The variation of the rigidity with respect to the bending stress caused by the flexural vibration on the +Z plane 16 and on the −Z plane 18 is most affected by the change of the mass at the base portion 12 side of the resonating arm 14. Therefore, even if the mass at the connecting electrode film 54 side is changed by the laser 90, the balance of the rigidities of the piezoelectric resonator element 10 is hardly affected. Accordingly, if the tuning fork type piezoelectric resonator element 10 of the sixth embodiment is mounted with the lid 88 made of a material through which the laser 90 is transmitted (thin plate glass, for example) as shown in FIG. 8, the resonance frequency can be fine-adjusted by irradiation of the laser 90 and the balance between the rigidities with respect to the bending stress caused by the flexural vibration can be adjusted by the irradiation of the laser 90 even after the mounting. At this time, any face of the +Z plane 16 and the −Z plane 18 may be used as a bonding face with respect to the mount electrode 84. Of course, the rigidity of the face from which the electrode film 74 is removed by the irradiation of the laser 90 is decreased.

According to the seventh embodiment, the acceleration sensor including the piezoelectric resonator element that uses the longitudinal direction as the acceleration detecting axis and reduces the sensitivity in other axis by reducing a vibrating component in the Z-axis direction of the flexural vibration can be formed. Further, the frequency adjustment after the mounting is conducted at the free end side of the resonating arm, while the rigidity adjustment is conducted at the base portion side of the resonating arm. Therefore, the frequency adjustment and the rigidity adjustment do not interfere with each other so as to be conducted independently.

The tuning fork type piezoelectric resonator element having two resonating arms that are cantilever-supported has been mentioned in the above embodiments, but it should be noted that the embodiments are applicable to even a resonator element having one resonating arm or a resonator element having two or more resonating arms. Further, the piezoelectric resonator element is applicable not only to the acceleration sensor but also other piezoelectric devices such as a clock source.

The piezoelectric resonator element of any of the embodiments includes: the resonating arm extending in a first direction and cantilever-supported; the base portion cantilever-supporting the resonating arm; and the excitation electrode allowing the resonating arm to perform flexural vibration in a second direction that is orthogonal to the first direction. In the resonator element, the resonating arm includes the adjusting part for the rigidity with respect to a bend in a third direction that is orthogonal to the first and second directions.

In the piezoelectric resonator element composed of a piezoelectric plate, rigidities with respect to a bending stress and the like on faces are sometimes different from each other due to the anisotropy of the plate. If such piezoelectric resonator element is allowed to perform flexural vibration by the excitation electrode, the vibration includes not only a component in a predetermined vibrating direction but also a component of vibration in a direction that is orthogonal to the predetermined vibrating direction. Therefore, according to the embodiments of the invention, balancing the rigidities with respect to the flexural vibration can reduce a component of vibration in a direction orthogonal to that of the flexural vibration of the resonating arm. Accordingly, the piezoelectric resonator element that reduces the occurrence of deviation, which is caused by the acceleration from the third direction, of the resonance frequency of the flexural vibration can be formed.

Therefore, the piezoelectric resonator element that performs the flexural vibration in a direction (the second direction, X direction) orthogonal to the longitudinal direction (the first direction, Y direction) and decreases the sensitivity in other axis by decreasing a vibrating component in the Z direction of the flexural vibration can be formed, and the piezoelectric resonator and the piezoelectric device including the piezoelectric resonator element supported at its base portion as a fixed end in a cantilever state can be formed.

The entire disclosure of Japanese Patent Application No. 2007-285890, filed Nov. 2, 2007 is expressly incorporated by reference herein.

What is claimed is:

1. A piezoelectric resonator element composed of a Z-cut piezoelectric plate in which two main planes regulating thickness cross a Z axis, comprising:
    a resonating arm, of which one end side, in a longitudinal direction, is a free end in a non-fixed state;
    a base portion that fixes another end side, in the longitudinal direction, of the resonating arm;
    a first groove that is arranged on a main plane of the +Z plane side of the resonating arm, along the longitudinal direction, and has a bottom in a shape in which it is cut out from the main plane in the thickness direction; and
    a second groove that is arranged on a main plane of the −Z plane side of the resonating arm, along the longitudinal direction, and has a bottom in a shape in which it is cut out from the main plane in the thickness direction;
    wherein
        an end that is on the base portion side of the second grove groove and positioned on the main plane side of the −Z plane side is positioned between (i) an end that is on the base portion side of the first groove and positioned on the main plane side of the +Z plane side and (ii) the free end, and wherein the end at the base portion side of the first groove is positioned closer to the base portion than the end at base portion side of the second groove,
        an end that is on the free end side of the second groove and positioned on the main plane side of the −Z plane side is positioned between (i) an end that is on the free end side of the first groove and positioned on the main plane side of the +Z plane side and (ii) the free end, and
        a region in which the first and second grooves are overlapped with each other as seen from the thickness direction is provided with a region in which the first and second grooves are overlapped with each other as seen from a longitudinal direction.

2. The piezoelectric resonator element according to claim 1, further comprising:
    a first electrode film arranged on the +Z plane of the resonating arm; and
    a second electrode film arranged on the −Z plane of the resonating arm, wherein
    the first electrode film is thinner than the second electrode film.

3. A piezoelectric resonator or an acceleration sensor, including:
    a piezoelectric resonator element composed of a Z-cut piezoelectric plate in which two main planes regulating thickness cross a Z axis, comprising:
        a resonating arm, of which one end side, in a longitudinal direction, is a free end in a non-fixed state;
        a base portion that fixes another end side, in the longitudinal direction, of the resonating arm;
        a first groove that is arranged on a main plane of the +Z plane side of the resonating arm, along the longitudinal direction, and has a bottom in a shape in which it is cut out from the main plane in the thickness direction; and
        a second groove that is arranged on a main plane of the −Z plane side of the resonating arm, along the longitudinal direction, and has a bottom in a shape in which it is cut out from the main plane in the thickness direction;
    wherein
        an end that is on the base portion side of the second grove groove and positioned on the main plane side of the −Z plane side is positioned between (i) an end that is on the base portion side of the first groove and positioned on the main plane side of the +Z plane side and (ii) the free end, and wherein the end at the base portion side of the first groove is positioned closer to the base portion than the end at the base portion side of the second groove,
        an end that is on the free end side of the second groove and positioned on the main plane side of the −Z plane side is positioned between (i) an end that is on the free end side of the first groove and positioned on the main plane side of the +Z plane side and (ii) the free end, and
        a region in which the first and second grooves are overlapped with each other as seen from the thickness direction is provided with a region in which the first and second grooves are overlapped with each other as seen from a longitudinal direction; and
    wherein the piezoelectric resonator element is cantilever-supported with the base portion as a fixed end, and mounted in a package.

4. The piezoelectric resonator element according to claim 3, further comprising:
    a first electrode film arranged on the +Z plane of the resonating arm; and
    a second electrode film arranged on the −Z plane of the resonating arm, wherein
    the first electrode film is thinner than the second electrode film.

* * * * *